United States Patent
Macabasco et al.

(10) Patent No.: US 11,762,016 B2
(45) Date of Patent: Sep. 19, 2023

(54) SIGNAL GENERATOR AND A METHOD FOR CONTROLLING THE SIGNAL GENERATOR

(71) Applicant: ANRITSU CORPORATION, Atsugi (JP)

(72) Inventors: Jesse Paulo Valencia Macabasco, Atsugi (JP); Koichiro Tomisaki, Atsugi (JP)

(73) Assignee: ANRITSU CORPORATION, Atsugi (JP)

(*) Notice: Subject to any disclaimer, the term of this patent is extended or adjusted under 35 U.S.C. 154(b) by 52 days.

(21) Appl. No.: 17/457,972

(22) Filed: Dec. 7, 2021

(65) Prior Publication Data
US 2022/0236327 A1     Jul. 28, 2022

(30) Foreign Application Priority Data
Jan. 25, 2021 (JP) .................... 2021-009307

(51) Int. Cl.
G01R 31/3185 (2006.01)
G01R 31/319 (2006.01)
G06F 11/27 (2006.01)

(52) U.S. Cl.
CPC ........ *G01R 31/318505* (2013.01); *G01R 31/31924* (2013.01); *G06F 11/27* (2013.01)

(58) Field of Classification Search
CPC ...... G01R 31/318505; G01R 31/31924; G06F 11/27
See application file for complete search history.

(56) References Cited

U.S. PATENT DOCUMENTS

| 5,845,191 A * | 12/1998 | Morgan | ........... H04N 7/17309 |
| | | | 348/E7.07 |
| 2013/0012139 A1* | 1/2013 | Otani | ........... H04B 17/14 |
| | | | 455/67.14 |

FOREIGN PATENT DOCUMENTS

| JP | 2013187803 A | 9/2013 |
| JP | 5612715 B2 * | 10/2014 |

* cited by examiner

*Primary Examiner* — Feba Pothen
(74) *Attorney, Agent, or Firm* — Greer, Burns & Crain, Ltd.

(57) ABSTRACT

A signal generator and a method for controlling the signal generator, capable of suppressing variation in the intensity of signals inputted to multiple devices under test are provided. An attenuation amount setting unit 15 sets a reference attenuation amount, obtained by subtracting the maximum amount of the losses stored in the cable loss storage unit 16 with respect to the cables 4a to 4f connected to the output ports 12a to 12f from a target attenuation amount, to the first attenuator 11, and sets an output attenuation amount, obtained by subtracting the losses stored in the cable loss storage unit 16 with respect to each of the cables 4a to 4f connected to the output ports 12a to 12f, from the maximum amount of the losses, to each of the second attenuators 14a to 14f.

5 Claims, 5 Drawing Sheets

|  | PortA (dB) | PortB (dB) | PortC (dB) | PortD (dB) |
| ---: | :---: | :---: | :---: | :---: |
| Loss Level | 4 | 5 | 3 | 11 |
| Basis Level | 11 | 11 | 11 | 11 |
| Loss Level Adjust | 7 | 6 | 8 | 0 |

FIG.2

|  | PortA (dB) | PortB (dB) | PortC (dB) | PortD (dB) |
|---|---|---|---|---|
| Loss Level | 4 | 5 | 2 | 11 |
| Basis Level | 11 | 11 | 11 | 11 |
| Loss Level Adjust | 7 | 6 | 9 | 0 |

FIG.3A

|  | PortA (dB) | PortB (dB) | PortC (dB) | PortD (dB) |
|---|---|---|---|---|
| Loss Level | 4 | 5 | 2 | 11 |
| Basis Level | 10 | 10 | 10 | 10 |
| Loss Level Adjust | 6 | 5 | 8 | −1 |

FIG.3B

|  | PortA (dB) | PortB (dB) | PortC (dB) | PortD (dB) |
|---|---|---|---|---|
| Loss Level | 4 | 5 | 2 | 11 |
| Basis Level | 10 | 10 | 10 | 10 |
| Loss Level Adjust | 6 | 5 | 8 | 0 |

FIG.3C

|  | PortA (dB) | PortB (dB) | PortC (dB) | PortD (dB) |
|---|---|---|---|---|
| Loss Level | −4 | −3 | 2 | 11 |
| Basis Level | 11 | 11 | 11 | 11 |
| Loss Level Adjust | 15 | 14 | 9 | 0 |

FIG.4A

|  | PortA (dB) | PortB (dB) | PortC (dB) | PortD (dB) |
|---|---|---|---|---|
| Loss Level | −4 | −3 | 2 | 11 |
| Basis Level | 4 | 4 | 4 | 4 |
| Loss Level Adjust | 8 | 7 | 2 | −7 |

FIG.4B

|  | PortA (dB) | PortB (dB) | PortC (dB) | PortD (dB) |
|---|---|---|---|---|
| Loss Level | −4 | −3 | 2 | 11 |
| Basis Level | 4 | 4 | 4 | 4 |
| Loss Level Adjust | 8 | 7 | 2 | 0 |

FIG.4C

SIGNAL GENERATOR AND A METHOD FOR CONTROLLING THE SIGNAL GENERATOR

CROSS-REFERENCE TO RELATED APPLICATIONS

This application claims Convention priority to Japanese Patent Application No. 2021-009307, filed Jan. 25, 2021, the entire contents of which are incorporated herein by reference.

FIELD OF THE INVENTION

The present invention relates to a signal generator and a method for controlling the signal generator.

BACKGROUND ART

Conventionally, for example, Patent Document 1 proposes a signal generator having a plurality of ports and performing a test while switching a plurality of devices under test connected to the plurality of ports.

CITATION LIST

Patent Literature

[Patent Document 1] Japanese Patent Application Publication No. 2013-187803

SUMMARY OF THE INVENTION

Technical Problem

However, in the conventional signal generator as described above, the loss of the cable for connecting to the device under test is not taken into consideration, so that there is such a problem that the intensity of the signals inputted to the plurality of devices under test varies.

The present invention has been made to solve such a problem, and it is the object of the present invention to provide a signal generator capable of suppressing variation in the intensity of signals inputted to a plurality of devices under test, and a method for controlling the signal generator.

Means to Solve the Problem

The signal generator of the present invention comprises: a signal generation unit (10) that generates a test signal; a first attenuator (11) that attenuates the test signal generated by the signal generation unit; a plurality of output ports (12$a$ to 12$f$) to which a plurality of devices under test (3$a$ to 3$f$) are connected through each of cables; a distributor (13) that distributes the test signal, attenuated by the first attenuator, to each of the plurality of output ports; a plurality of second attenuators (14$a$ to 14$f$) that attenuate each of the test signals outputted from the distributor; an attenuation amount setting unit (15) that sets attenuation amount of the first attenuator and the plurality of second attenuators; and a cable loss storage unit (16) that stores losses of the cables connected to the plurality of output ports, wherein the attenuation amount setting unit is configured to set a reference attenuation amount, obtained by subtracting the maximum amount of the losses stored in the cable loss storage unit with respect to the cables connected to the output ports from a target attenuation amount, to the first attenuator, and to set an output attenuation amount, obtained by subtracting the losses stored in the cable loss storage unit with respect to each of the cables connected to the output ports from the maximum amount of the losses, to each of the second attenuators.

By this configuration, the signal generator of the present invention can suppress the variation in the intensity of the test signals inputted to the plurality of devices under test connected to the output ports, since the attenuation amounts of the first attenuator and the second attenuator are set in consideration of the loss of each of the cables connected to the output ports.

Further, since the signal generator of the present invention can input the test signals in which the variation in intensity is suppressed to a plurality of devices under test connected to the output ports in parallel, the test time can be shortened.

The signal generator of the present invention may be so configured that, when any one of the output attenuation amounts exceeds a specified amount, the attenuation amount setting unit corrects the reference attenuation amount with the correction attenuation amount obtained by subtracting the specified amount from the output attenuation amount exceeding the specified amount, sets the reference attenuation amount to the first attenuator, and recalculates the output attenuation amount by subtracting the correction attenuation amount from the maximum amount of the losses.

By this configuration, the signal generator of the present invention can prevent a test signal having an unexpected intensity from being inputted to the device under test, by setting a specified amount within a range not exceeding the allowable attenuation amount of the second attenuator.

Further, in the signal generator of the present invention, the attenuation amount setting unit may be so configured to change the output attenuation amount to 0, when any of the output attenuation amounts becomes negative as a result of recalculating the output attenuation amount.

By this configuration, the signal generator of the present invention can prevent the second attenuator from setting a negative output attenuation amount that cannot be set to the second attenuator.

Further, the signal generator of the present invention may be so configured to comprise a notification unit (17) capable of notifying information on each output port of the plurality of output ports, and the attenuation amount setting unit may be so configured to notify the information on the output port corresponding to the second attenuator whose output attenuation amount has been changed to 0 as a result of the output attenuation amount of any one of the output attenuation amounts turning negative.

By this configuration, the signal generator of the present invention can notify the output port to which the cable with too much loss is connected.

A method for controlling a signal generator of the present invention is a method for controlling a signal generator (1), comprising: a signal generation unit (10) that generates a test signal; a first attenuator (11) that attenuates the test signal generated by the signal generation unit; a plurality of output ports (12$a$ to 12$f$) to which a plurality of devices under test (3$a$ to 3$f$) are connected through each of cables (4$a$ to 4$f$); a distributor (13) that distributes the test signal, attenuated by the first attenuator, to each of the plurality of output ports; a plurality of second attenuators (14$a$ to 14$f$) that attenuate each of the test signals outputted from the distributor; an attenuation amount setting unit (15) that sets attenuation amount of the first attenuator and the plurality of second attenuators; and a cable loss storage unit (16) that stores losses of the cables connected to the plurality of output ports, the method causing the attenuation amount setting unit to execute: a first setting step to set an attenuation amount, obtained by subtracting the maximum amount of the losses stored in the cable loss storage unit with respect to the cables connected to the output ports from a target attenuation amount, to the first attenuator; and a second setting step to set an output attenuation amount, obtained by subtracting the losses stored in the cable loss storage unit with respect to each of the cables connected to the output ports, from the maximum amount of the losses, to each of the second attenuators.

As described above, the method for controlling the signal generator of the present invention can suppress the variation in the intensity of test signals inputted to the plurality of devices under test connected to the output ports, since the attenuation amount of the first attenuator and the second attenuators are set in consideration of the loss of each of the cables connected to the output ports.

Effect of the Invention

The present invention can provide a signal generator and a method for controlling the signal generator, capable of suppressing the variation in the intensity of signals inputted to a plurality of devices under test.

BRIEF DESCRIPTION OF DRAWINGS

FIG. 2 is a first conceptual diagram for explaining a configuration of an attenuation amount setting unit constituting a signal generator according to an embodiment of the present invention.

FIGS. 3A, 3B, and 3C collectively constitute a second conceptual diagram for explaining a configuration of an attenuation amount setting unit constituting a signal generator according to an embodiment of the present invention.

FIG. 3A shows an example in which the output attenuation amount exceeds the specified amount is shown, FIG. 3B shows an example in which the output attenuation amount is corrected so as not to exceed the specified amount, and FIG. 3C shows an example in which the output attenuation amount is corrected so as not to be negative.

FIGS. 4A, 4B, and 4C collectively constitute a third conceptual diagram for explaining a configuration of an attenuation amount setting unit constituting a signal generator according to an embodiment of the present invention.

FIG. 4A shows an example in which the output attenuation amount exceeds the specified amount.

FIG. 4B shows an example in which the output attenuation amount is corrected so as not to exceed the specified amount.

FIG. 4C shows an example in which the output attenuation amount is corrected so as not to be negative.

DETAILED DESCRIPTION OF EMBODIMENTS

Hereinafter, embodiments of the present invention will be described with reference to the drawings.

Figure 1:
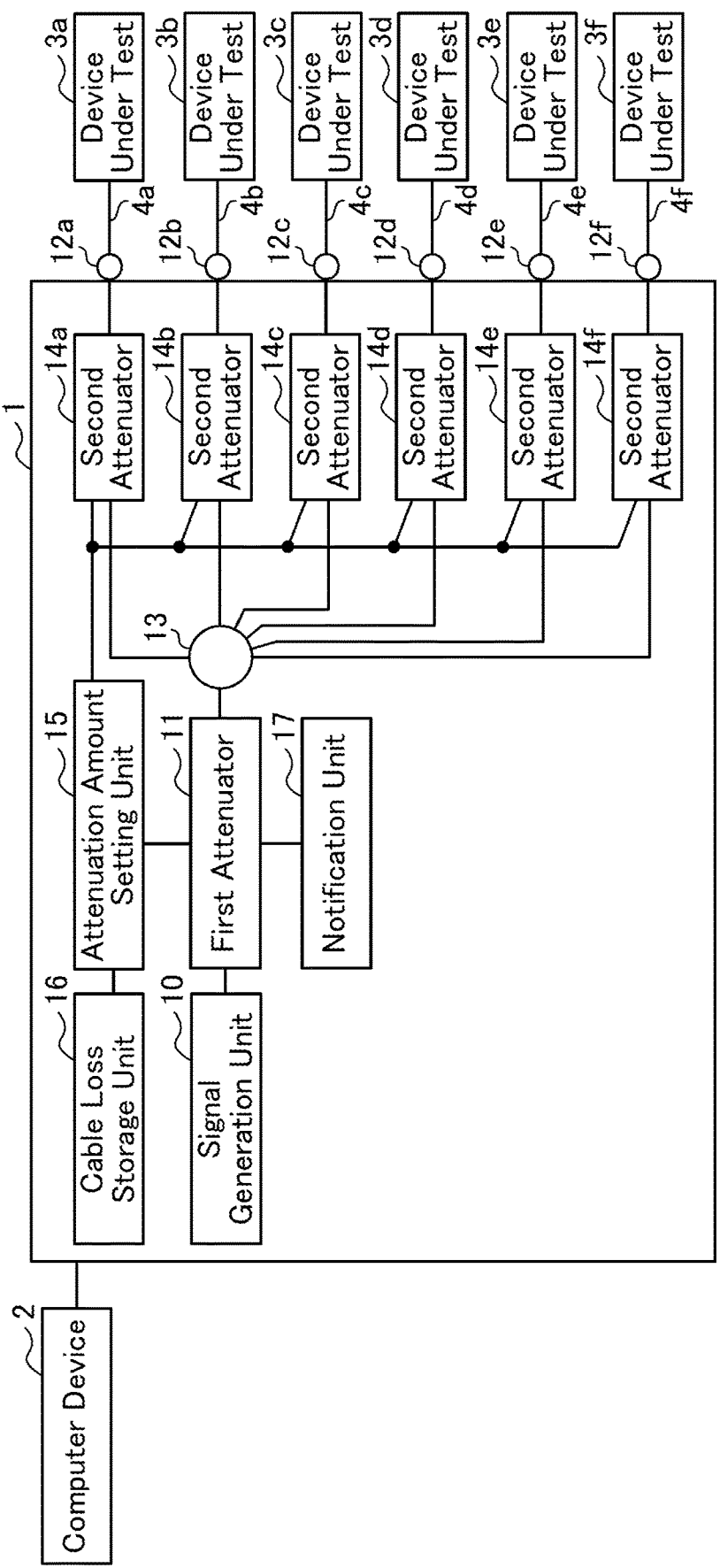
FIG. 1 is a block diagram of a signal generator according to an embodiment of the present invention.

As shown in FIG. 1, a control computer device 2 is connected to a signal generator 1. The computer device 2 is constituted by a general-purpose computer device. This computer device includes a CPU (Central Processing Unit), a ROM (Read Only Memory), a RAM (Random Access Memory), a hard disk device, a communication module, a display device, and an input device such as a pointing device, a keyboard device, and the like, which are not shown.

The signal generator 1 comprises of a signal generation unit 10 that generates a test signal, a first attenuator 11 that attenuates the test signal generated by the signal generation unit 10, output ports 12a to 12f to which devices under test 3a to 3f are respectively connected through cables 4a to 4f, and a distributor 13 that distributes the test signal attenuated by the first attenuator 11 to output ports 12a to 12f.

Further, the signal generator 1 includes second attenuators 14a to 14f that respectively attenuate the test signals distributed to the output ports 12a to 12f, an attenuation amount setting unit 15 that sets the attenuation amount of the first attenuator 11 and the second attenuators 14a to 14f, a cable loss storage unit 16 that stores the loss of cables 4a to 4f connected to the plurality of output ports 12a to 12f, and a notification unit 17 capable of notifying information on each output port of the plurality of output ports 12a to 12f.

In the present embodiment, the cables 4a to 4f are composed of, for example, a coaxial cable, and the output ports 12a to 12f are composed of a coaxial connector. Although FIG. 1 shows an example in which the signal generator 1 has six output ports 12a to 12f, it is sufficient for the signal generator 1 to have two or more output ports.

Each output port 12a to 12f can be set to either effective or ineffective by the computer device 2. The test signal is outputted from the output port that is set to be effective among the output ports 12a to 12f, but the test signal is not outputted from the output port that is set to be ineffective. In the following description, the output port that is set to be effective is also referred to as "effective port".

The signal generation unit 10 is composed of a signal generator that generates a test signal of the intensity and frequency set by the computer device 2. The first attenuator 11 and the second attenuators 14a to 14f are composed of a digital control type variable attenuator or a voltage control type variable attenuator.

The cable loss storage unit 16 is composed of a rewritable non-volatile storage medium such as a flash memory. In the cable loss storage unit 16, a loss table representing the loss of the cables 4a to 4f connected to the output ports 12a to 12f with respect to the combinations of the output ports 12a to 12f and the measurement frequency (hereinafter, also simply referred to as "cable loss") is stored. The loss table can be rewritten from the computer device 2, thereby allowing the user to set the loss table according to the test environment.

The attenuation amount setting unit 15 is composed of, for example, an ASIC (Application Specific Integrated Circuit). The attenuation amount setting unit 15 sets the attenuation amount individually for the first attenuator 11 and the second attenuators 14a to 14f based on the loss table stored in the cable loss storage unit 16.

The notification unit 17 is composed of LEDs (Light Emitting Diodes) corresponding to the output ports 12a to 12f, and external output terminals for outputting the information on the output ports 12a to 12f to an external device such as the computer device 2.

Hereinafter, the configuration of the attenuation amount setting unit 15 will be described in detail with reference to FIGS. 2 to 4. FIGS. 2 to 4 collectively show an example in which the test signal of the measurement frequency generated by the signal generation unit 10 is attenuated and outputted from the effective ports PortA to PortD.

In FIGS. 2 to 4, "Loss Level" represents the cable loss of each PortA to PortD stored in the loss table, "Basis Level"

represents the maximum amount of the cable loss of each PortA to PortD stored in the loss table. (Hereinafter referred to as "maximum cable loss"), and "Loss Level Adjust" represents the attenuation amount set in the second attenuator corresponding to each PortA to PortD.

In FIG. 2, the cable loss of each Port A to Port D stored in the loss table with respect to the measurement frequency is defined as "4", "5", "3", and "11". The attenuation amount setting unit 15 sets a reference attenuation amount obtained by subtracting the maximum cable loss "11" from the target attenuation amount to the first attenuator 11.

Further, the attenuation amount setting unit 15 sets the output attenuation amounts "7", "6", "8", and "0" obtained by subtracting the cable loss of each of PortA to PortD stored in the loss table from the maximum cable loss to the second attenuator corresponding to each PortA to PortD. By configuring the attenuation amount setting unit 15 in this way, test signals attenuated by the target attenuation amount are inputted to the devices under test connected to each Port A to Port D.

FIGS. 3A, 3B, and 3C collectively show an example in which the output attenuation amount exceeds a specified amount ("8" in this example) according to an allowable attenuation of the second attenuators 14a to 14f, as compared with the example shown in FIG. 2. In FIG. 3A, the cable loss of each PortA to PortD stored in the loss table with respect to the measurement frequency is defined as "4", "5", "2", and "11". The attenuation amount setting unit 15 sets a reference attenuation amount obtained by subtracting the maximum cable loss "11" from the target attenuation amount to the first attenuator 11.

Further, the attenuation amount setting unit 15 sets the output attenuation amounts "7", "6", "9", "0", obtained by subtracting the cable loss of each of PortA to PortD stored in the loss table from the maximum cable loss, to the second attenuator corresponding to each PortA to PortD. In this case, the output attenuation amount "9" set in the second attenuator corresponding to PortC exceeds the specified amount "8".

When the output attenuation amount exceeds the specified amount in this way, the attenuation amount setting unit 15 corrects the reference attenuation amount with the correction attenuation amount "1" obtained by subtracting the specified amount "8" from the output attenuation amount "9" exceeding the specified amount, and sets the reference attenuation amount to the first attenuator 11. This means that the attenuation amount setting unit 15 adds the correction attenuation amount to the reference attenuation amount set in the first attenuator 11.

Further, as shown in FIG. 3B, the attenuation amount setting unit 15 recalculates the output attenuation amount by subtracting the correction attenuation amount "1" from the maximum cable loss "11". This means that the maximum cable loss is "10", and the output attenuation amounts set in the second attenuator corresponding to each PortA to PortD are "6", "5", "8", and "−1".

However, since a negative output attenuation amount cannot be set in the second attenuator, the attenuation amount setting unit 15 changes the negative output attenuation amount to "0". This means that, in this example, as shown in FIG. 3C, the attenuation amount setting unit 15 sets the output attenuation amount "0" to the second attenuator corresponding to PortD.

Thus, when the negative output attenuation amount is changed to "0", the attenuation amount setting unit 15 causes the notification unit 17 to notify the corresponding port. For example, the attenuation amount setting unit 15 lights the LED which is arranged corresponding to PortD.

FIGS. 4A, 4B, and 4C collectively show an example in which the cable loss stored in the loss table contains a negative amount. Specifically, if the amplifier is placed between the output port and the cable, between the cables, or between the cable and the devices under test, the cable loss is set to a negative value.

In FIG. 4A, the cable loss of each PortA to PortD stored in the loss table with respect to the measurement frequency is defined as "−4", "−3", "2", and "11". The attenuation amount setting unit 15 sets a reference attenuation amount obtained by subtracting the maximum cable loss "11" from the target attenuation amount to the first attenuator 11.

Further, the attenuation amount setting unit 15 sets the output attenuation amounts "15", "14", "9", and "0" obtained by subtracting the cable loss of each PortA to PortD stored in the loss table from the maximum cable loss to each PortA to PortD the corresponding second attenuator. In this case, the output attenuation amounts "15", "14", and "9" set in the second attenuator corresponding to each PortA to PortC exceed the specified amount "8".

When a plurality of output attenuation amounts exceed the specified amount in this way, the attenuation amount setting unit 15 corrects the reference attenuation amount with the correction attenuation amount "7" obtained by subtracting the specified amount "8" from the maximum amount "15" of the output attenuation amount exceeding the specified amount, and sets the reference attenuation amount to the first attenuator 11. This means that the attenuation amount setting unit 15 adds the correction attenuation amount to the reference attenuation amount set in the first attenuator 11.

Further, as shown in FIG. 4B, the attenuation amount setting unit 15 recalculates the output attenuation amount by subtracting the correction attenuation amount "7" from the maximum cable loss "11". This means that the maximum cable loss is "4", and the output attenuation amounts set in the second attenuators corresponding to each PortA to PortD are "8", "7", "2", and "−7". However, since a negative output attenuation amount cannot be set in the second attenuator, the attenuation amount setting unit 15 sets the output attenuation amount "0" to the second attenuator corresponding to the PortD, as shown in FIG. 4C.

The attenuation amount setting operation of the signal generator 1 according to the embodiment of the present invention configured as described above will be described with reference to FIG. 5.

First, in step S1, the attenuation amount setting unit 15 calculates a reference attenuation amount obtained by subtracting the maximum cable loss of the cable loss of each effective port stored in the loss table from the target attenuation amount with respect to the measurement frequency. After executing the process of step S1, the attenuation amount setting unit 15 executes the process of step S2.

In step S2, the attenuation amount setting unit 15 calculates the output attenuation amount obtained by subtracting the cable loss of each effective port stored in the loss table from the maximum cable loss. After executing the process of step S2, the attenuation amount setting unit 15 executes the process of step S3.

In step S3, the attenuation amount setting unit 15 determines whether or not there is an output attenuation amount exceeding the specified amount. If it is determined that there is no output attenuation amount exceeding the specified amount, the attenuation amount setting unit 15 executes the process of step S11. If it is determined that there is an output attenuation amount exceeding the specified amount, the attenuation amount setting unit 15 executes the process of step S4.

In step S4, the attenuation amount setting unit 15 calculates a correction attenuation amount obtained by subtracting the specified amount from the maximum amount of the output attenuation amount exceeding the specified amount. After executing the process of step S4, the attenuation amount setting unit 15 executes the process of step S5.

In step S5, the attenuation amount setting unit 15 corrects the reference attenuation amount with the correction attenuation amount. After executing the process of step S5, the attenuation amount setting unit 15 executes the process of step S6. In step S6, the attenuation amount setting unit 15 corrects the maximum cable loss by subtracting the correction attenuation amount from the maximum cable loss. After executing the process of step S6, the attenuation amount setting unit 15 executes the process of step S7.

In step S7, the attenuation amount setting unit 15 recalculates the output attenuation amount by subtracting the cable loss of each effective port stored in the loss table from the corrected maximum cable loss. After executing the process of step S7, the attenuation amount setting unit 15 executes the process of step S8.

In step S8, the attenuation amount setting unit 15 determines whether or not there is a negative output attenuation amount. If it is determined that there is a negative output attenuation amount, the attenuation amount setting unit 15 executes the process of step S9. If it is determined that there is no negative output attenuation amount, the attenuation amount setting unit 15 executes the process of step S11.

In step S9, the attenuation amount setting unit 15 changes the negative output attenuation amount to 0. After executing the process of step S9, the attenuation amount setting unit 15 executes the process of step S10.

In step S10, the attenuation amount setting unit 15 causes the notification unit 17 to notify the output port in which the output attenuation amount is changed to 0. After executing the process of step S10, the attenuation amount setting unit 15 executes the process of step S11.

In step S11, the attenuation amount setting unit 15 sets the reference attenuation amount to the first attenuator 11. Step S11 corresponds to the first setting step. After executing the process of step S11, the attenuation amount setting unit 15 executes the process of step S12.

In step S12, the attenuation amount setting unit 15 sets each output attenuation amount to the corresponding second attenuator. Step S12 corresponds to the second setting step. After executing the process of step S12, the attenuation amount setting unit 15 ends the attenuation amount setting operation.

As shown in FIGS. 3B and 4B, the factor that causes the negative output attenuation amount lies in the fact that the difference between the maximum amount and the minimum amount of the cable loss stored in the loss table corresponding to the effective port exceeds the specified amount.

Therefore, the attenuation amount setting unit 15 may confirm that the difference between the maximum amount and the minimum amount of the cable loss corresponding to the effective port does not exceed the specified amount, at a predetermined timing before setting the attenuation amount of the first attenuator 11 and the second attenuators 14a to 14f.

The predetermined timing, including when the loss table is changed, when the elements of the loss table are changed, when the measurement frequency is changed, when the effective port is changed, and the like, can be determined based on the test scenario controlled by the computer device 2.

When the difference between the maximum amount and the minimum amount of the cable loss corresponding to the effective port exceeds the specified amount, the attenuation amount setting unit 15 causes the notification unit 17 to notify the port until the difference between the maximum amount and the minimum amount of the cable loss corresponding to the effective port does not exceed the specified amount.

For example, the attenuation amount setting unit 15 may light the LED arranged in correspondence to the port having the maximum amount of cable loss, may light the LED arranged in correspondence to the port having the minimum amount of cable loss, and may light the LEDs arranged in correspondence to the ports having the maximum amount and the minimum amount of the cable loss.

Further, when lighting the LEDs arranged in correspondence to the ports where the cable loss is the maximum amount and the minimum amount, the attenuation amount setting unit 15 may change the emission color of the LEDs depending on whether the cable loss is the maximum amount or the minimum amount.

Figure 5:
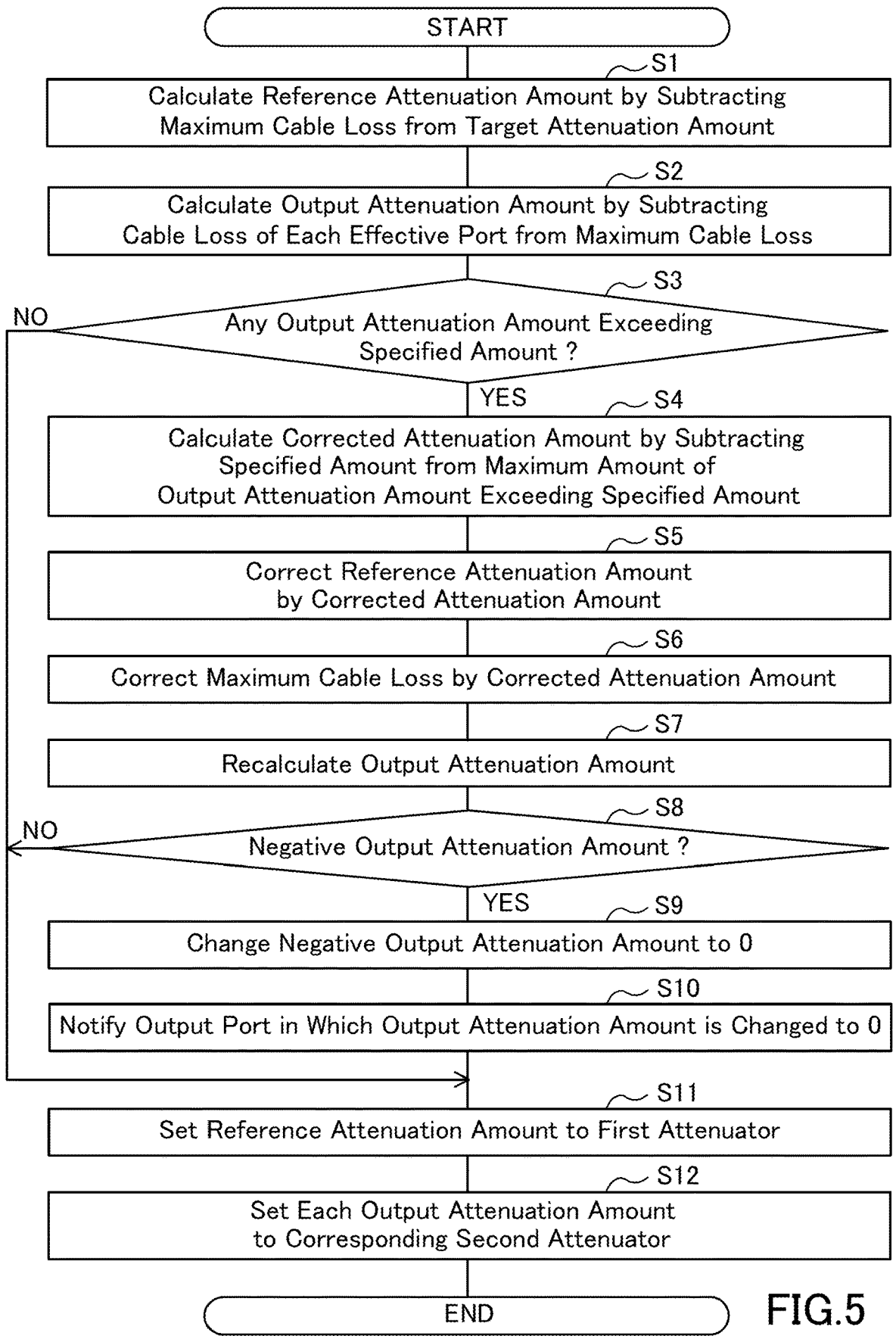
FIG. 5 is a flowchart showing an attenuation amount setting operation of the signal generator according to one embodiment of the present invention.

In this way, since the attenuation amount setting unit 15 confirms the loss table in advance, the processing in the case that the output attenuation amount exceeds the specified amount corresponding to the allowable attenuation amount of the second attenuators 14a to 14f, which is, steps S3 to S10 of the attenuation amount setting operation of the signal generator 1 described with reference to FIG. 5 can be omitted.

As described above, in the present embodiment, since the attenuation amounts of the first attenuator 11 and the second attenuators 14a to 14f are set in consideration of the loss of the cables 4a to 4f connected to the output ports 12a to 12f, it is possible to suppress the variation in the intensity of the test signals inputted to the devices under test 3a to 3f connected to the output ports 12a to 12f, respectively.

Further, in the present embodiment, the test signal in which the variation in intensity is suppressed can be inputted in parallel to the devices under test 3a to 3f connected to the output ports 12a to 12f, respectively, so that the test time can be shortened.

Further, in the present embodiment, by setting a specified amount within a range not exceeding the allowable attenuation amount of the second attenuators 14a to 14f, it is possible to prevent a test signal having an unexpected intensity from being inputted to each of the devices under test 3a to 3f.

Further, in the present embodiment, since when any one of the output attenuation amounts becomes negative as a result of recalculating the output attenuation amount, the output attenuation amount is set to 0, it is possible to prevent a negative output attenuation amount that cannot be set to the second attenuators 14a to 14f from being set to the second attenuators 14a to 14f.

Further, in the present embodiment, since the notification unit 17 is caused to notify the information on the output port corresponding to the second attenuator in which the output attenuation amount is changed to 0, it is possible to notify the output port to which the cable having too large loss is connected.

In the present embodiment, an example in which the signal generator 1 and the computer device 2 are separately configured has been described, but in the signal generator of the present invention, the signal generator 1 and the computer device 2 may be integrally configured.

Although the embodiments of the present invention have been disclosed above, it is easy to make changes to the embodiments without departing from the scope of the present invention. Embodiments of the present invention are disclosed on the premise that the equivalents to which such modifications have been made are included in the invention described in the claims.

EXPLANATION OF REFERENCE NUMERALS

1 Signal Generator
3*a*-3*f* Device Under Test
4*a*-4*f* Cable
10 Signal Generation Unit
11 First Attenuator
12*a*-12*f* Output Port
13 Distributor
14*a*-14*f* Second Attenuator
15 Attenuation Amount Setting Unit
16 Cable Loss Storage Unit
17 Notification Unit

What is claimed is:

1. A signal generator comprising:
   a signal generation unit that generates a test signal;
   a first attenuator that attenuates the test signal generated by the signal generation unit;
   a plurality of output ports to which a plurality of devices under test are connected in parallel through each of cables;
   a distributor that distributes the test signal, attenuated by the first attenuator, to each of the plurality of output ports;
   a plurality of second attenuators that attenuate each of the test signals outputted from the distributor;
   an attenuation amount setting unit consisting of ASIC that sets attenuation amount of the first attenuator and the plurality of second attenuators; and
   a cable loss storage unit that stores losses of the cables connected to the plurality of output ports, wherein
   the attenuation amount setting unit is configured to set a reference attenuation amount, obtained by subtracting a maximum amount of the losses stored in the cable loss storage unit with respect to the cables connected to the output ports from a target attenuation amount, to the first attenuator, and to set an output attenuation amount, obtained by subtracting the losses stored in the cable loss storage unit with respect to each of the cables connected to the output ports from the maximum amount of the losses, to each of the second attenuators.

2. The signal generator according to claim 1, wherein when any one of the output attenuation amounts exceeds a specified amount, the attenuation amount setting unit corrects the reference attenuation amount with the correction attenuation amount obtained by subtracting the specified amount from the output attenuation amount exceeding the specified amount, sets the reference attenuation amount to the first attenuator, and recalculates the output attenuation amount by subtracting a correction attenuation amount from the maximum amount of the losses.

3. The signal generator according to claim 2, wherein the attenuation amount setting unit is so configured to change the output attenuation amount to 0, when any of the output attenuation amounts becomes negative as a result of recalculating the output attenuation amount.

4. The signal generator according to claim 3, wherein the signal generator comprises a notification unit capable of notifying information on each output port of the plurality of output ports, and
the attenuation amount setting unit notifies the information on the output port corresponding to the second attenuator whose output attenuation amount has been changed to 0 as a result of the output attenuation amount of any one of the output attenuation amounts turning negative.

5. A method for controlling a signal generator, comprising:
   a signal generation unit that generates a test signal;
   a first attenuator that attenuates the test signal generated by the signal generation unit;
   a plurality of output ports to which a plurality of devices under test are connected in parallel through each of cables;
   a distributor that distributes the test signal, attenuated by the first attenuator, to each of the plurality of output ports;
   a plurality of second attenuators that attenuate each of the test signals outputted from the distributor;
   an attenuation amount setting unit consisting of ASIC that sets attenuation amount of the first attenuator and the plurality of second attenuators; and
   a cable loss storage unit that stores losses of the cables connected to the plurality of output ports,
   the method causing the attenuation amount setting unit to execute:
   a first setting step to set an attenuation amount, obtained by subtracting a maximum amount of the losses stored in the cable loss storage unit with respect to the cables connected to the output ports from a target attenuation amount, to the first attenuator; and
   a second setting step to set an output attenuation amount, obtained by subtracting the losses stored in the cable loss storage unit with respect to each of the cables connected to the output ports, from the maximum amount of the losses, to each of the second attenuators.

* * * * *